(12) United States Patent
Nakanishi et al.

(10) Patent No.: US 10,826,526 B2
(45) Date of Patent: Nov. 3, 2020

(54) MEMORY SYSTEM AND INFORMATION PROCESSING SYSTEM

(71) Applicant: TOSHIBA MEMORY CORPORATION, Tokyo (JP)

(72) Inventors: Keiri Nakanishi, Kawasaki Kanagawa (JP); Youhei Fukazawa, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/549,371

(22) Filed: Aug. 23, 2019

(65) Prior Publication Data

US 2020/0304142 A1   Sep. 24, 2020

(30) Foreign Application Priority Data

Mar. 19, 2019 (JP) ................... 2019-050997

(51) Int. Cl.
| | |
|---|---|
| *H03M 7/34* | (2006.01) |
| *H03M 7/30* | (2006.01) |
| *G06F 3/06* | (2006.01) |
| *G06F 12/02* | (2006.01) |
| *G06F 9/54* | (2006.01) |

(52) U.S. Cl.
CPC ........ *H03M 7/3059* (2013.01); *G06F 3/0623* (2013.01); *G06F 3/0659* (2013.01); *G06F 3/0679* (2013.01); *G06F 12/0238* (2013.01); *G06F 9/544* (2013.01)

(58) Field of Classification Search
CPC ..... H03M 7/3059; H03M 7/00; G06F 3/0659; G06F 3/0623; G06F 12/0238; G06F 3/0679; G06F 9/544

USPC ................................................. 341/50, 51
See application file for complete search history.

(56) References Cited

U.S. PATENT DOCUMENTS

| | | | | |
|---|---|---|---|---|
| 6,791,877 | B2 * | 9/2004 | Miura ............... | G11O 5/02 365/185.11 |
| 8,751,756 | B2 * | 6/2014 | Lee ............... | G06F 12/0246 711/154 |
| 8,904,103 | B2 * | 12/2014 | Taniyama ............ | G06F 3/0686 707/654 |
| 9,377,961 | B2 * | 6/2016 | McCarty .......... | G11B 20/00007 |
| 9,696,910 | B2 | 7/2017 | Manning et al. | |
| 9,792,172 | B2 | 10/2017 | Kanno | |
| 10,097,202 | B1 | 10/2018 | Ki et al. | |
| 2010/0088464 | A1 * | 4/2010 | Yang ............... | G06F 12/0246 711/103 |
| 2013/0238838 | A1 | 9/2013 | Fukutomi et al. | |
| 2013/0342375 | A1 | 12/2013 | Manning et al. | |

(Continued)

FOREIGN PATENT DOCUMENTS

JP          6096291 B2      3/2017

*Primary Examiner* — Jean B Jeanglaude
(74) *Attorney, Agent, or Firm* — Kim & Stewart LLP

(57) ABSTRACT

A memory system includes a nonvolatile memory, an interface circuit, and a controller configured to upon receipt of a plurality of write commands for storing write data in the nonvolatile memory via the interface circuit, acquire compression-ratio information about the write data associated with each write command, determine a compression ratio of each write data based on the acquired compression-ratio information, and determine an execution order of the write commands based on the determined compression ratio.

20 Claims, 11 Drawing Sheets

(56) References Cited

U.S. PATENT DOCUMENTS

| | | |
|---|---|---|
| 2015/0149739 A1 | 5/2015 | Seo et al. |
| 2016/0055094 A1* | 2/2016 | Patsilaras ............ G06F 12/0893 |
| | | 711/118 |
| 2016/0092361 A1* | 3/2016 | Grimsrud ............. H04N 19/423 |
| | | 19/423 |
| 2018/0088812 A1* | 3/2018 | Lee ....................... G06F 3/0625 |
| 2018/0276144 A1 | 9/2018 | Kodama |

* cited by examiner

MEMORY SYSTEM AND INFORMATION PROCESSING SYSTEM

CROSS-REFERENCE TO RELATED APPLICATION

This application is based upon and claims the benefit of priority from Japanese Patent Application No. 2019-050997, filed Mar. 19, 2019, the entire contents of which are incorporated herein by reference.

FIELD

Embodiments described herein relate generally to a memory system and an information processing system.

BACKGROUND

In a memory system including a nonvolatile memory, upon receipt of a write command from a host, the memory system executes the write command to write the data into the nonvolatile memory. For such a memory system, various techniques have been developed to improve efficiency of writing data into the nonvolatile memory.

DETAILED DESCRIPTION

Figure 1:
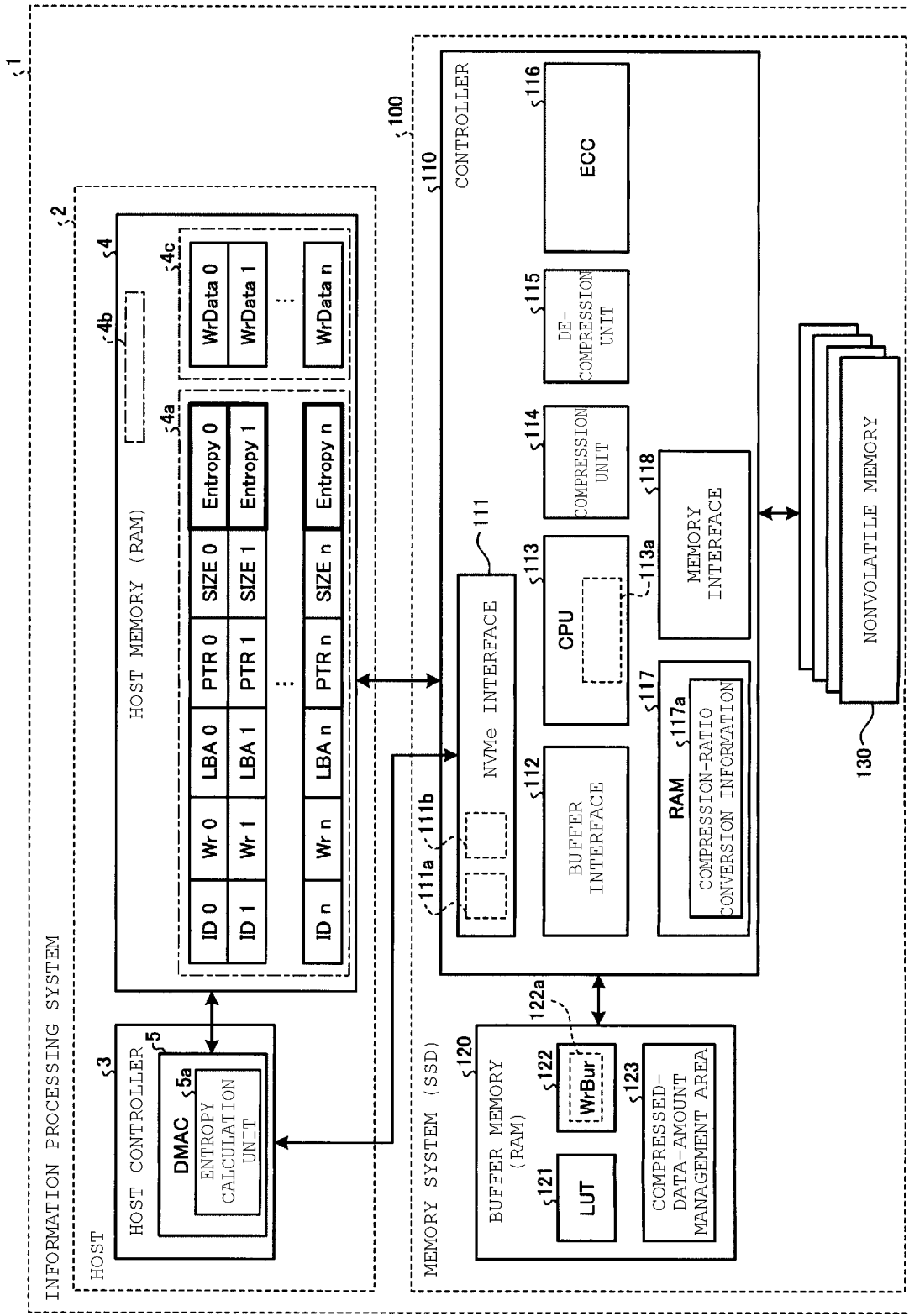
FIG. 1 is a diagram illustrating a configuration of an information processing system including a memory system according to a first embodiment.

Embodiments provide a memory system and an information processing system capable of efficiently writing write data in a nonvolatile memory.

In general, according to one embodiment, a memory system includes a nonvolatile memory, an interface circuit, and a controller configured to upon receipt of a plurality of write commands for storing write data in the nonvolatile memory via the interface circuit, acquire compression-ratio information about the write data associated with each write command, determine a compression ratio of each write data based on the acquired compression-ratio information, and determine an execution order of the write commands based on the determined compression ratio.

Hereinafter, a memory system according to an embodiment will be described in detail with reference to the accompanying drawings. The present disclosure is not limited to the following embodiments.

First Embodiment

A memory system according to a first embodiment is a storage system including a nonvolatile memory. Upon receiving a write command instructing writing of write data from a host or the like, the memory system executes the write command on the nonvolatile memory. Thereby, the write data is written in the nonvolatile memory.

In order to increase a storage capacity of the memory system, a method of compressing the write data (e.g., user data) and writing the compressed write data into the nonvolatile memory has been developed. For this reason, the memory system has a data compression function. Thus, the memory system compresses the data to be written, and executes the write command to write the compressed write data into the nonvolatile memory. The user data is compressed using a lossless compression method, and as a result, a size of the compressed user data tends to vary.

In the nonvolatile memory, writing of data into a memory cell array is performed in a predetermined unit of writing (hereinafter referred to as a write unit). In the nonvolatile memory, when a write data size is not an integer multiple of the write unit size, dummy data is added to the write data to fill up an unwritten area of a write unit (referred to herein as waste area) so that the size of the write data plus the dummy data is an integer multiple of the write unit size. In writing of the compressed write data, a size of the compressed write data tends to vary, and this tendency becomes significant. As a result, the amount of the unwritten areas tends to increase. This may result in a reduction in efficiency of writing of the write data into the nonvolatile memory, and it may be difficult to efficiently use a storage capacity of the memory system.

Furthermore, a method of dividing compression ratios into a plurality of levels, providing a buffer memory including a plurality of buffer areas corresponding to the plurality of compression-ratio levels, compressing the write data, measuring a compression ratio of the write data, and storing each write data in the buffer area corresponding to the compression-ratio level, has been developed. In this case, in order to efficiently fit the compressed write data in the write unit according to the compression-ratio level of the write data and reduce the amount of the unwritten area, the write command execution order may be changed.

However, when the buffer memory including the plurality of buffer areas corresponding to the plurality of compression-ratio levels is provided, a buffer memory having a large capacity is required. As a result, a cost of the memory system may be increased.

Therefore, in the memory system according to the present embodiment, by estimating a compression ratio of the write data using compression-ratio estimation information linked to the write command (i.e., a hint of the compression ratio), and determining an execution order of the write command based on the estimated compression ratio, it is possible to prevent an increase in capacity of the buffer memory and improve efficiency in writing of the write data. The compression-ratio estimation information may be included in the write command.

Specifically, the host and the memory system according to the present embodiment have the following features (1) and (2).

(1) Entropy information of the write data is calculated by the host before transmission of the write command, and the entropy information is linked to the write command, as a hint for predicting a size of the compressed write data. The entropy information is, for example, information indicating to what degree the write data can be compressed.

(2) The memory system determines the execution order of the write command based on a remaining data-writable amount of the predetermined write unit, by referring to the entropy information linked to the write command. The compressed data may be rearranged based on the entropy information, and thus it is possible to make the buffer area as small as the predetermined write unit. In addition, the write command based on the NVMe standard may be executed in an out-of-order manner.

More specifically, an information processing system 1 including a memory system 100 may have the configuration illustrated in FIG. 1. FIG. 1 is a diagram illustrating a configuration of the information processing system 1 including the memory system 100.

The memory system 100 is connected to a host 2 so as to communicate with the host 2, and functions as an external storage device for the host 2. The memory system 100 is, for example, a flash memory for embedded use based on the universal flash storage (UFS) standard or the embedded multimedia card (eMMC) standard, a solid state drive (SSD), or the like. The host 2 is, for example, a microprocessor, an imaging device, a PC, or the like. In the following, a case where the host 2 and the memory system 100 transmit and receive a packet based on the nonvolatile memory express (NVMe) standard via a communication path will be described as an example.

The host 2 and the memory system 100 may transmit and receive a packet based on the UFS standard, the serial attached SCSI (SAS) standard, the serial advanced technology attachment (SATA) standard, or the peripheral component interconnect express (PCIe) standard, instead of the NVMe standard.

The host 2 includes a host controller 3 and a host memory 4. The host controller 3 includes a direct memory access controller (DMAC) 5. The DMAC 5 includes an entropy calculation unit 5a. When the DMAC 5 issues a write command, the entropy calculation unit 5a obtains compression-ratio estimation information (for example, entropy information) as a hint of a compression ratio of write data corresponding to the write command by checking appearance frequencies of symbols in the write data. The DMAC 5 issues a write command including the compression-ratio estimation information obtained by the entropy calculation unit 5a.

The host memory 4 includes a command issue queue 4a, a command completion queue 4b, and a buffer area 4c. In the command issue queue 4a, the write command issued by the DMAC 5 is queued. The command issue queue 4a basically has a FIFO (First-In, First Out) structure, and may have an out-of-order execution structure. In the command completion queue 4b, completion information of the write command, which indicates completion of the command execution by the memory system 100, is queued. In the buffer area 4c, write data corresponding to the write command that is queued in the command issue queue 4a is stored.

For example, assuming that the queued order is represented by i (i=1 to n, n is an integer of two or more), the write command $WC_i$ includes identification information $ID_i$, a command type Wr, a start address $LBA_i$, a pointer $PRT_i$, data size information $SIZE_i$, and entropy information $Entropy_i$. The identification information $ID_i$ identifies the write command $WC_i$ from other write commands $WC_i$. The command type Wr indicates a type of the command (in this case, the write command). The start address $LBA_i$ indicates a logical address of a head portion of the write data. The pointer $PRT_i$ indicates a storage location of the write data in the buffer area 4c (i.e., an address of the write data in the buffer area 4c). The data size information $SIZE_i$ indicates a size of the write data (i.e., a size of the uncompressed write data). The entropy information $Entropy_i$ is entropy information of the write data obtained by the entropy calculation unit 5a.

The memory system 100 includes a controller 110, a buffer memory 120, and a nonvolatile memory 130. The controller 110 includes an NVMe interface 111, a buffer interface 112, a CPU 113, a compression unit 114, a decompression unit 115, an error correction circuit (ECC) 116, a random access memory (RAM) 117, and a memory interface 118.

The nonvolatile memory 130 includes a plurality of memory chips. Each memory chip includes a memory cell array. In the memory cell array of each memory chip, a unit of writing and reading, in which data can be collectively written and read, is a physical page. A smallest access unit, which is made up of a plurality of physical pages, and which is a unit of data erasing, is a physical block. A data management unit, which has a size smaller than a size of one physical page, is a cluster. It is assumed that data in the nonvolatile memory 130 is managed by the CPU 113. A cluster size is equal to or larger than a size of a sector, which is a smallest access unit of the host 2, and is determined such that a natural number times the cluster size corresponds to the physical page size. One physical page may include four clusters, and one logical page may include 64 clusters.

For example, a size of the write unit may be a cluster size, a page size, a block size, or a size different from these sizes. The cluster size may be 4 KB, and the page size may be 16 KB.

The NVMe interface 111 is an interface circuit based on the NVMe standard, and includes a doorbell register 111a and a doorbell register 111b. The doorbell register 111a is a register corresponding to the command issue queue 4a of the host memory 4. For example, a valid bit for notifying that the issued write command is stored in the doorbell register 111a by the host 2. When the valid bit is stored in the doorbell register 111a, the NVMe interface 111 accesses the command issue queue 4a of the host memory 4, and acquires the write command, for example, in order of issuance (i.e., in queued order).

The doorbell register 111b is a register corresponding to the command completion queue 4b of the host memory 4. For example, a valid bit for notifying confirmation of the completion information is stored in the doorbell register 111b by the host 2.

The CPU 113 controls each part of the controller 110. When the write command is acquired via the NVMe interface 111, the CPU 113 determines a storage area of the write data (i.e., write destination) in the nonvolatile memory 130, and correlates the logical address included in the write command with the physical address corresponding to the storage area. The correlation between the logical address and the physical address is managed as LUT (i.e., address conversion information) 121. The LUT 121 is stored in the buffer memory 120. The CPU 113 reads the LUT 121, and caches the LUT 121 in the RAM 117 or the like as necessary. The CPU 113 may update the LUT 121 each time the correlation between the logical address and the physical address is changed.

The RAM 117 functions as a work area by the CPU 113. The RAM 117 temporarily stores the LUT 121. In addition, the RAM 117 also stores compression-ratio conversion information 117a. The compression-ratio conversion information 117a is information in which entropy and a compression ratio are correlated with each other for a plurality of different pieces of entropy.

The buffer memory 120 functions as a memory area that temporarily stores information. For example, the buffer memory 120 may be a general-purpose memory such as a static random access memory (SRAM) or a dynamic random access memory (DRAM). In addition, the buffer memory 120 may be provided in the controller 110, or may be provided outside the controller 110 independently of the controller 110. The LUT 121 is stored in the buffer memory 120. In addition, in the buffer memory 120, a write buffer (WrBuf) 122 is allocated as an area for storing the write data. In the buffer memory 120, a compressed-data-amount management area 123 is allocated as an area which stores information for managing a size of the write data when the write data is compressed.

The CPU 113 is programmed to function as a command execution order determination unit 113a. Alternatively, the command execution order determination unit 113a may be implemented by a logic circuit. The command execution order determination unit 113a estimates a compression ratio of the write data using the compression-ratio estimation information linked to the write command.

The command execution order determination unit 113a may specify the entropy information included in the write command acquired by the NVMe interface 111, as the compression-ratio estimation information. In addition, as the entropy information is specified, the command execution order determination unit 113a may estimate the compression ratio of the write data by reading the compression-ratio conversion information 117a from the RAM 117 and specifying the compression ratio corresponding to the entropy information of the compression-ratio conversion information 117a. The command execution order determination unit 113a determines an execution order of the plurality of write commands on the nonvolatile memory 130 based on the estimated compression ratio.

For example, the command execution order determination unit 113a allocates a storage area 122a with a size (for example, a page size, a cluster size, or a block size) corresponding to the write unit, on the write buffer 122. The command execution order determination unit 113a writes the total size of the compressed write data in the compressed-data-amount management area 123 based on the estimated compression ratio when the write data is mapped in the storage area 122a in order of issuance of the plurality of write commands. The command execution order determination unit 113a determines whether the write data fits in the storage area 122a based on the total size of the compressed data written in the compressed-data-amount management area 123. When the write data does not fit in the storage area 122a, the command execution order determination unit 113a determines the execution order of the plurality of write commands to be different from the order of issuance.

The CPU 113 instructs an execution of the write command in the execution order determined by the command execution order determination unit 113a.

The memory interface 118 is an interface circuit connected to the nonvolatile memory 130 via a bus, and controls communication with the nonvolatile memory 130. For example, when the execution of the write command is instructed from the CPU 113, the memory interface 118 transfers the write command instructed from the CPU 113 and the write data, to the nonvolatile memory 130. In addition, when the execution of the write command which is instructed by the CPU 113 and is received via the memory interface 118 is completed, the nonvolatile memory 130 transmits a completion notification to the memory interface 118, and the memory interface 118 receives the completion notification from the nonvolatile memory 130.

When receiving the completion notification corresponding to the write command instructed by the CPU 113 via the memory interface 118, the CPU 113 registers completion information indicating the execution completion of the write command in the command completion queue 4b of the host memory 4 via the NVMe interface 111.

The buffer interface 112 is a controller circuit that controls access from the controller 110 to the buffer memory 120, and enables access to the buffer memory 120 at, for example, a double data rate (DDR).

The ECC 116 performs error correction coding on the write data under the control of the CPU 113. The ECC 116 generates a parity based on the write data, and generates write data including the parity.

The compression unit 114 compresses the write data including the parity under the control of the CPU 113 before the write data is written in the nonvolatile memory 130. The compression unit 114 compresses the write data using a lossless compression method. The compression unit 114 may be a hardware engine or an intellectual property core (IP core).

The decompression unit 115 decompresses compressed read data, which is read from the nonvolatile memory 130, under the control of the CPU 113. The decompression unit 115 decompresses the compressed read data using a lossless decompression method. The decompression unit 115 may be a hardware engine or an IP core.

The ECC 116 performs error correction decoding on the decompressed read data under the control of the CPU 113. The ECC 116 extracts a parity from the read data, and corrects an error bit based on the parity.

Figure 2:
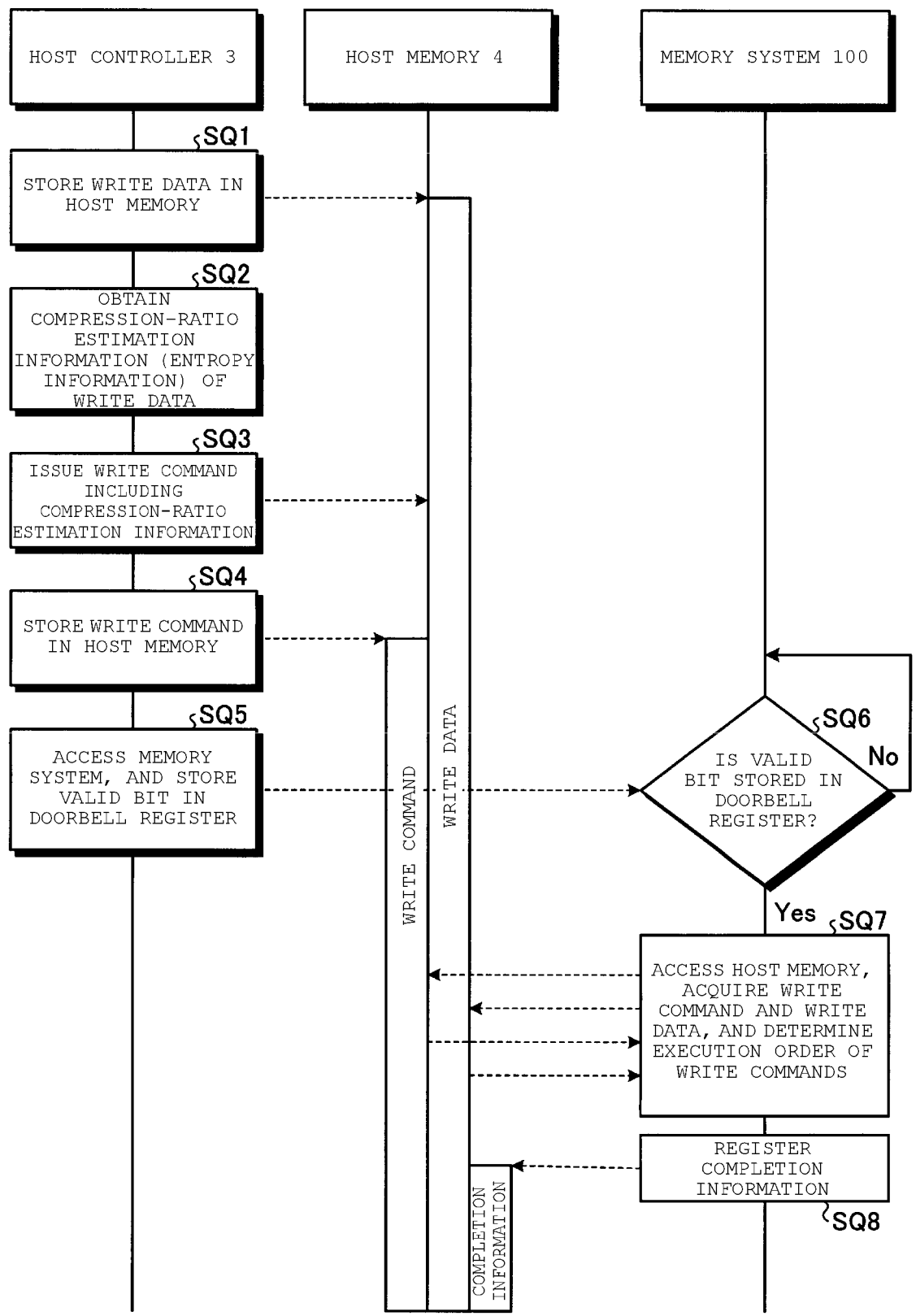
FIG. 2 is a sequence diagram illustrating an operation performed by the information processing system including the memory system according to the first embodiment.

Next, an operation of the information processing system 1 including the memory system 100 will be described with reference to FIG. 2. FIG. 2 is a sequence diagram illustrating an operation of the information processing system 1 including the memory system 100.

The host 2 transfers write data to a specific address on the host memory 4 (SQ1). At this time, the host 2 obtains compression-ratio estimation information (i.e., entropy information) of the write data (SQ2). The host 2 obtains the entropy information based on, for example, redundancy of a bit value of the write data.

Figure 3:
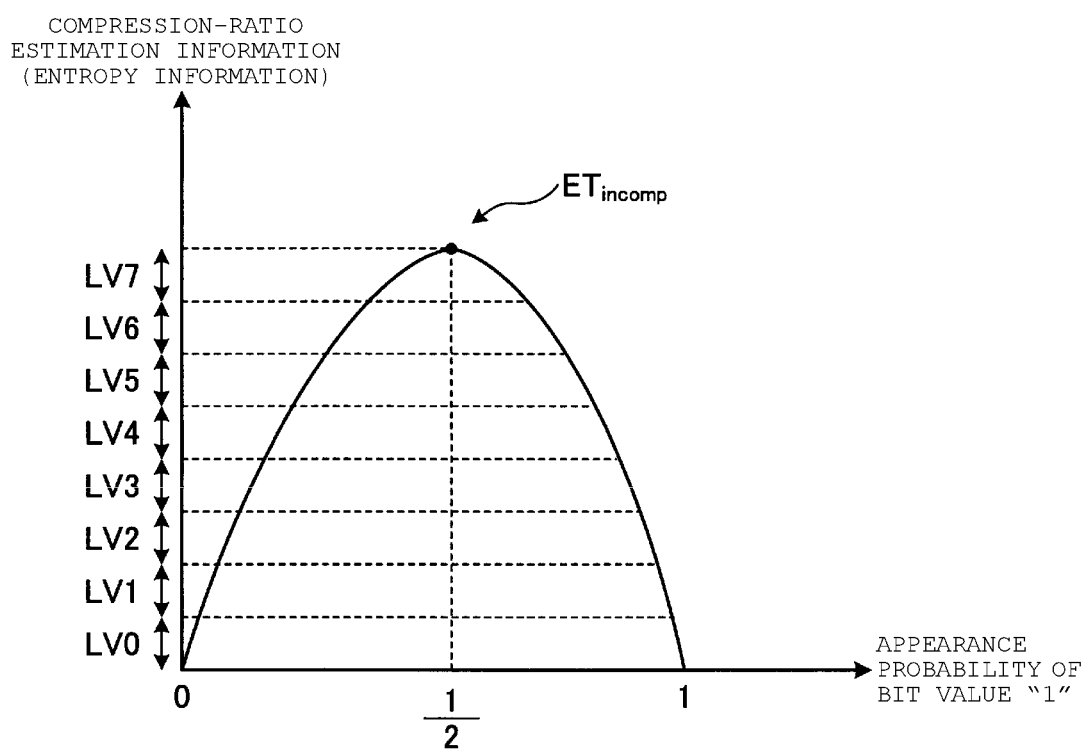
FIG. 3 is a diagram illustrating processing of obtaining compression-ratio estimation information according to the first embodiment.

For example, as illustrated in FIG. 3, the host 2 may obtain the entropy information by confirming an appearance probability of a bit value "1" of the write data and ranking the appearance probability in a plurality of levels (e.g., eight levels in the case of FIG. 3) based on the confirmation result. FIG. 3 is a diagram illustrating processing of obtaining the compression-ratio estimation information (i.e., entropy information). As illustrated in FIG. 3, when the appearance probability of the bit value "1" is ½, a maximum entropy value $ET_{incomp}$ indicating that the write data is incompressible may be obtained.

Returning to FIG. 2, the host 2 issues a write command including the compression-ratio estimation information (i.e., entropy information) obtained in SQ2 (SQ3), and queues the write command in the command issue queue 4a on the host memory 4.

Thereafter, the host 2 accesses the memory system 100, and stores a valid bit in the doorbell register 111a of the NVMe interface 111. Thereby, the host 2 calls the memory system 100 for an execution of the write command.

The memory system 100 waits until a valid bit is stored in the doorbell register 111a ("No" in SQ6). When a valid bit is stored in the doorbell register 111a ("Yes" in SQ6), the memory system 100 functions as a master. Thus, the memory system 100 directly accesses the command issue queue 4a and the buffer area 4c of the host memory 4, and acquires the write command and the write data. The memory system 100 estimates a compression ratio of the write data using the compression-ratio estimation information (for example, the entropy information included in the write command) linked to the write command. The memory system 100 determines an execution order of the plurality of write commands on the nonvolatile memory 130 based on the estimated compression ratio (SQ7). The memory system 100 writes the write data in the nonvolatile memory 130 from the write buffer 122 via the ECC 116 according to the determined execution order. When the writing is completed, the memory system 100, as a master, directly accesses the command completion queue 4b of the host memory 4, and registers completion information in the command completion queue 4b (SQ8). When confirming that the completion information is registered in the command completion queue 4b, the host 2 accesses the memory system 100, and stores a valid bit in the doorbell register 111b of the NVMe interface 111. Thereby, the host 2 notifies the memory system 100 of confirmation of the completion information. In addition, the host 2 may dequeue and discard the write command corresponding to the completion information from the command issue queue 4a, and delete the write data corresponding to the completion information from the buffer area 4c.

Processing of SQ2 may be performed for a plurality of pieces of write data stored in the buffer area 4c at once when the DMAC 5 of the host 2 confirms the plurality of pieces of write data.

In addition, the write command based on the NVMe standard includes only one bit of field indicating whether the write data is incompressible (for example, whether the entropy has the maximum value $ET_{incomp}$ illustrated in FIG. 3). For this reason, in SQ3, as a field of the write command including the compression-ratio estimation information, an unused field of the write command based on the NVMe standard (e.g., a reserved field) may be used.

Figure 4:
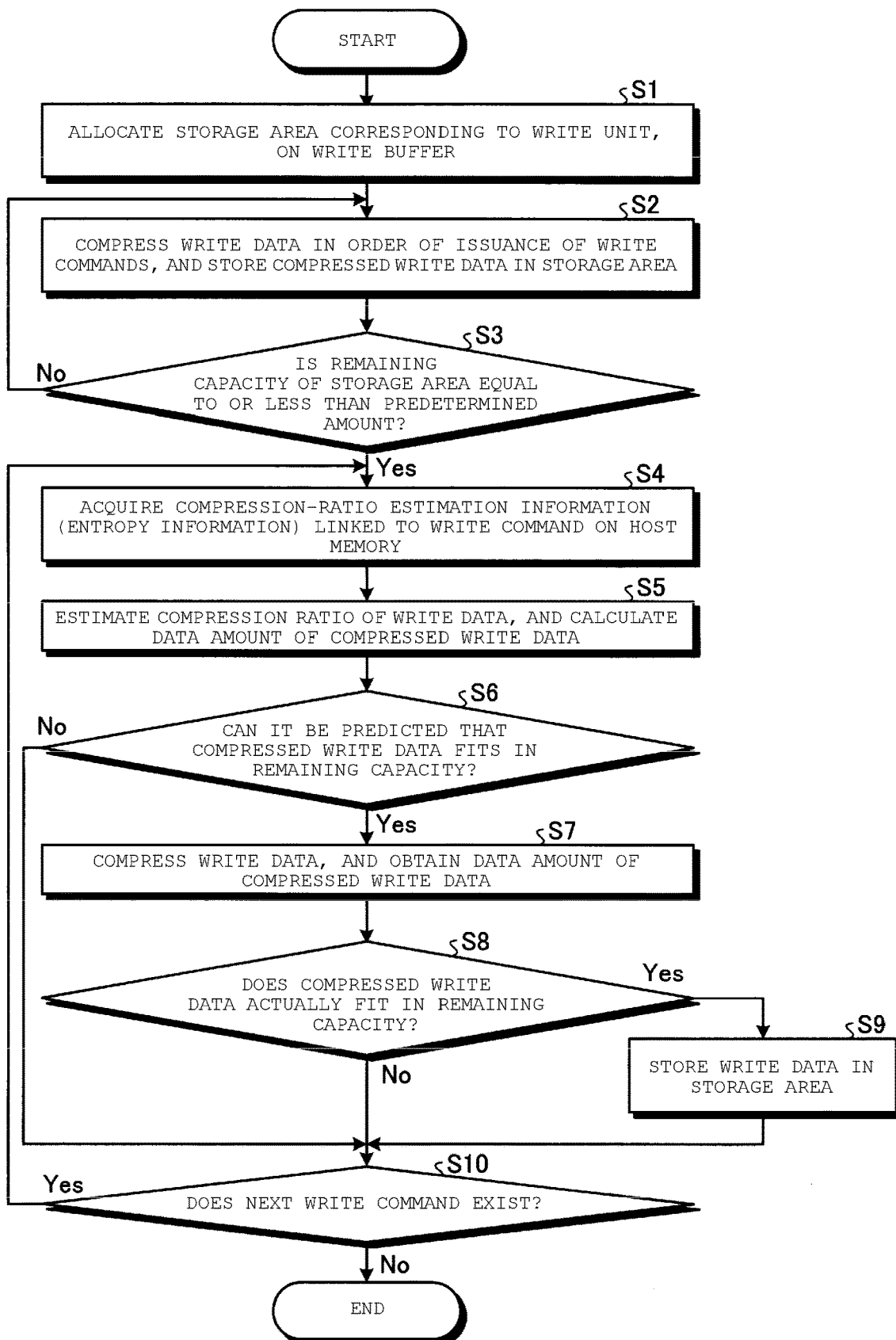
FIG. 4 is a flowchart illustrating command execution order determination processing according to the first embodiment.
Figure 5:
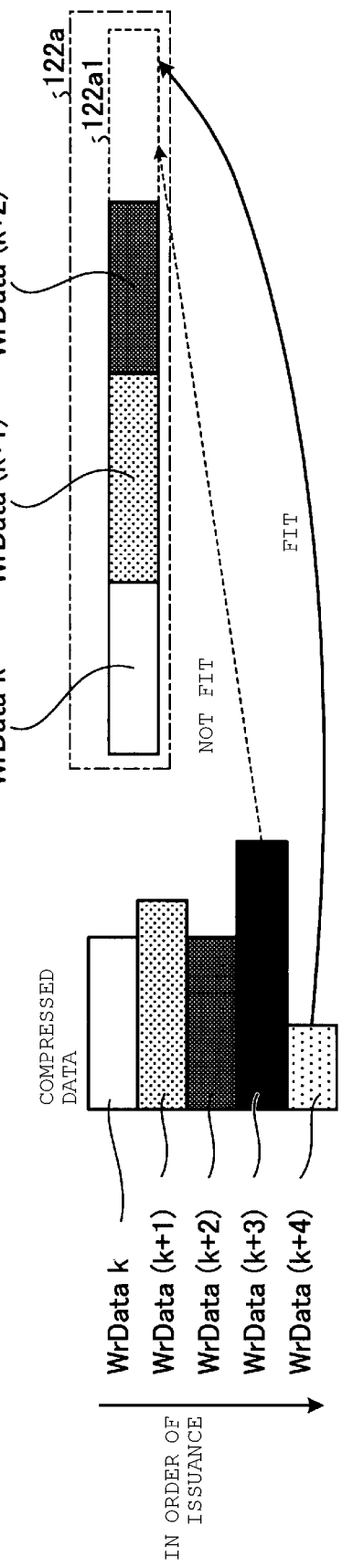
FIG. 5 is a diagram illustrating the command execution order determination processing according to the first embodiment.

Next, command execution order determination processing of SQ7 will be described in detail with reference to FIG. 4 and FIG. 5. FIG. 4 is a flowchart illustrating the command execution order determination processing. FIG. 5 is a diagram illustrating the command execution order determination processing. The command execution order determination processing illustrated in FIG. 4 is executed by, for example, the NVMe interface 111, the command execution order determination unit 113a, the compression unit 114, and the buffer interface 112 of the controller 110.

The memory system 100 allocates a storage area 122a having a size corresponding to the predetermined write unit (for example, a page size, a cluster size, or a block size), on the write buffer 122 of the buffer memory 120 (S1). The memory system 100 writes the compressed write data in the storage area 122a (S2). The memory system 100 performs processing of S2 in order of issuance of the write commands until a data amount of a remaining area 122a1 of the storage area 122a (i.e., a size of the remaining area 122a1) becomes equal to or less than a predetermined amount ("No" in S3).

For example, in the example of FIG. 5, assuming that k is an integer of two or more, write data WrDatak, write data WrData(k+1), and write data WrData(k+2) are written in the storage area 122a in order of issuance of the write commands.

When the data amount of the remaining area 122a1 of the storage area 122a allocated on the write buffer 122 in S1 is equal to or less than the predetermined amount ("Yes" in S3), the memory system 100 acquires the compression-ratio estimation information linked to the write command on the host memory 4 (S4). For example, the memory system 100 may acquire the entropy information included in the write command, as the compression-ratio estimation information.

The memory system 100 estimates a compression ratio of the write data, and calculates a data amount of the compressed write data (S5). The memory system 100 may estimate the compression ratio by reading the compression-ratio conversion information 117a from the RAM 117 and referring to the compression-ratio conversion information 117a.

Figure 6:
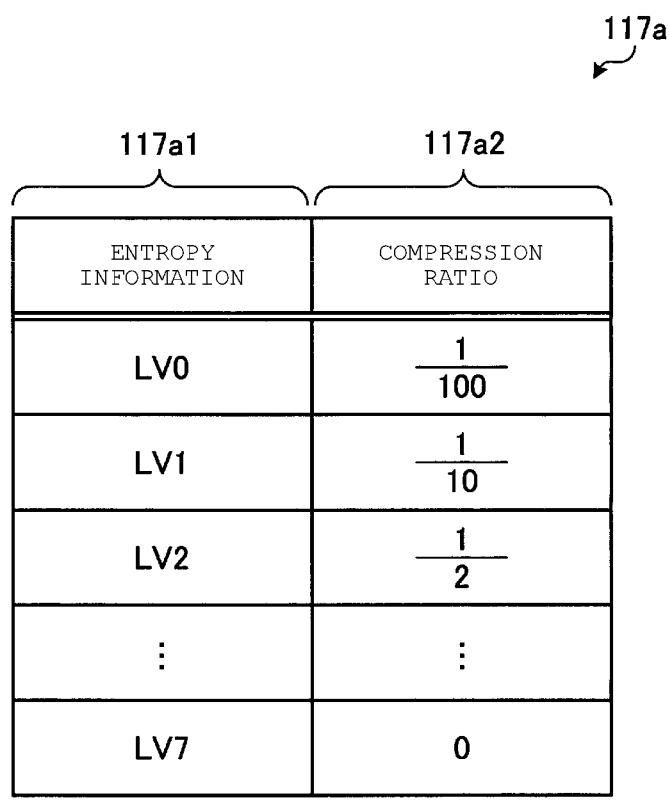
FIG. 6 is a diagram illustrating a data structure of the compression-ratio conversion information according to the first embodiment.

For example, the compression-ratio conversion information 117a has a data structure as illustrated in FIG. 6. FIG. 6 is a diagram illustrating a data structure of the compression-ratio conversion information 117a. The compression-ratio conversion information 117a is information in which entropy and a compression ratio are correlated with each other for a plurality of different pieces of entropy. The compression-ratio conversion information 117a includes an entropy information field 117a1 and a compression-ratio field 117a2. The memory system 100 can specify the compression ratio corresponding to the entropy information by referring to the compression-ratio conversion information 117a. When the entropy information is "LV0", the memory system 100 can specify that the compression ratio is approximately "1/100". When the entropy information is "LV1", the memory system 100 can specify that the compression ratio is approximately "1/10". When the entropy information is "LV7", the memory system 100 can specify that the compression ratio is approximately "0".

The memory system 100 may estimate the compression ratio of the write data by specifying the compression ratio corresponding to the entropy information of the compression-ratio conversion information 117a. The memory system 100 may calculate the data amount of the compressed write data by, for example, multiplying a size of the uncompressed write data by the compression ratio.

The memory system 100 determines whether the compressed write data is likely to fit in the remaining area 122a1 of the storage area 122a allocated on the write buffer 122, based on the data amount of the write data calculated in S5 (S6).

When it is determined that the write data does is not likely to fit in the remaining area 122a1 of the storage area 122a allocated on the write buffer 122 ("No" in S6), the memory system 100 does not store the write data in the remaining area 122a1 of the storage area 122a allocated on the write buffer 122, and determines whether a next write command exists (S10). When a next write command exists ("Yes" in S10), the memory system. 100 performs processing of S4 and subsequent processing for the next write command. When a next write command does not exist ("No" in S10), the memory system 100 ends processing.

For example, the example of FIG. 5 illustrates a case where it is determined that the write data WrData(k+3) is not likely to fit in the remaining area 122a1 of the storage area 122a allocated on the write buffer 122.

When it is determined that the write data is likely to fit in the remaining area 122a1 of the storage area 122a allocated on the write buffer 122 ("Yes" in S6), the memory system 100 compresses the write data, and obtains the data amount of the compressed write data (S7). The memory system 100 determines whether the compressed write data actually fits in the remaining area 122a1 of the storage area 122a allocated on the write buffer 122, based on the data amount obtained in S7 (S8).

For example, the example of FIG. 5 illustrates a case where it is determined that the next write data WrData(k+4) after the write data WrData (k+3) actually fits in the remaining area 122a1.

When the compressed write data actually fits in the remaining area 122a1 of the storage area 122a allocated on the write buffer 122 ("Yes" in S8), the memory system 100 stores the write data in the storage area 122a (that is, the remaining area 122a1) (S9).

When the compressed write data actually does not fit in the remaining area 122a1 of the storage area 122a allocated on the write buffer 122 ("No" in S8), the memory system 100 determines whether a next write command exists without writing anything in the remaining area 122a1 (S10). When a next write command exists ("Yes" in S10), the memory system 100 performs processing of S4 and subsequent processing for the next write command. When a next write command does not exist ("No" in S10), the memory system 100 ends processing.

As described above, the memory system 100 can determine whether the write data is likely to fit in the remaining area 122a1 of the predetermined area 122a after compressing the data, by referring to the entropy information. As a result, a situation where it turns out that the write data does not fit in the remaining area 122a1 after the compression is avoided. This is significant especially when the compression unit 114 of the memory system 100 adopts the same compression method as the compression method used in calculation of the entropy information. Therefore, it is possible to efficiently write the write data in the nonvolatile memory 130 without providing a buffer memory including a plurality of buffer areas corresponding to a plurality of levels.

Furthermore, by using the compression-ratio conversion information 117a (refer to FIG. 6) in which the compression-ratio estimation information and the predicted compression ratio are correlated with each other, the memory system 100 can precisely determine the compression ratio, and can avoid a situation where it turns out that the write data does not fit in the remaining area 122a1 after performing the compression.

As described above, in the first embodiment, the memory system 100 estimates the compression ratio of the write data using the compression-ratio estimation information (i.e., a hint of the compression ratio) linked to the write command, and determines the execution order of the write command based on the estimated compression ratio. Thereby, it is possible to efficiently write the write data in the nonvolatile memory 130 while preventing an increase in capacity of the buffer memory.

In addition to the method illustrated in FIG. 4, there is also a method of clustering a write command group for each compression ratio expected from entropy information of the write command group, compressing the write data for each cluster, and writing the compressed write data in the storage area 122a corresponding to the write unit. For example, clustering may be performed by classifying the write command group into a plurality of subgroups based on the compression-ratio levels expected from the entropy information. When the write command group is classified into two subgroups, the write commands linked to the entropy information LV0 to LV3 (refer to FIG. 3) are classified into a first subgroup, and the write commands linked to the entropy information LV4 to LV7 are classified into a second subgroup. First, the write commands belonging to the first subgroup are written in the storage area 122a in the order of issuance of the write commands, and then the write commands belonging to the second subgroup are written in the storage area 122a in the order of issuance of the write commands. Thereby, the write commands corresponding to similar compression ratios of the write data are collectively written in the storage area 122a, and thus it is possible to determine the execution order of the write commands while reducing an influence by a variation in compression ratio.

Second Embodiment

Next, a memory system according to a second embodiment will be described. Hereinafter, differences from the first embodiment will be mainly described.

Figure 7:
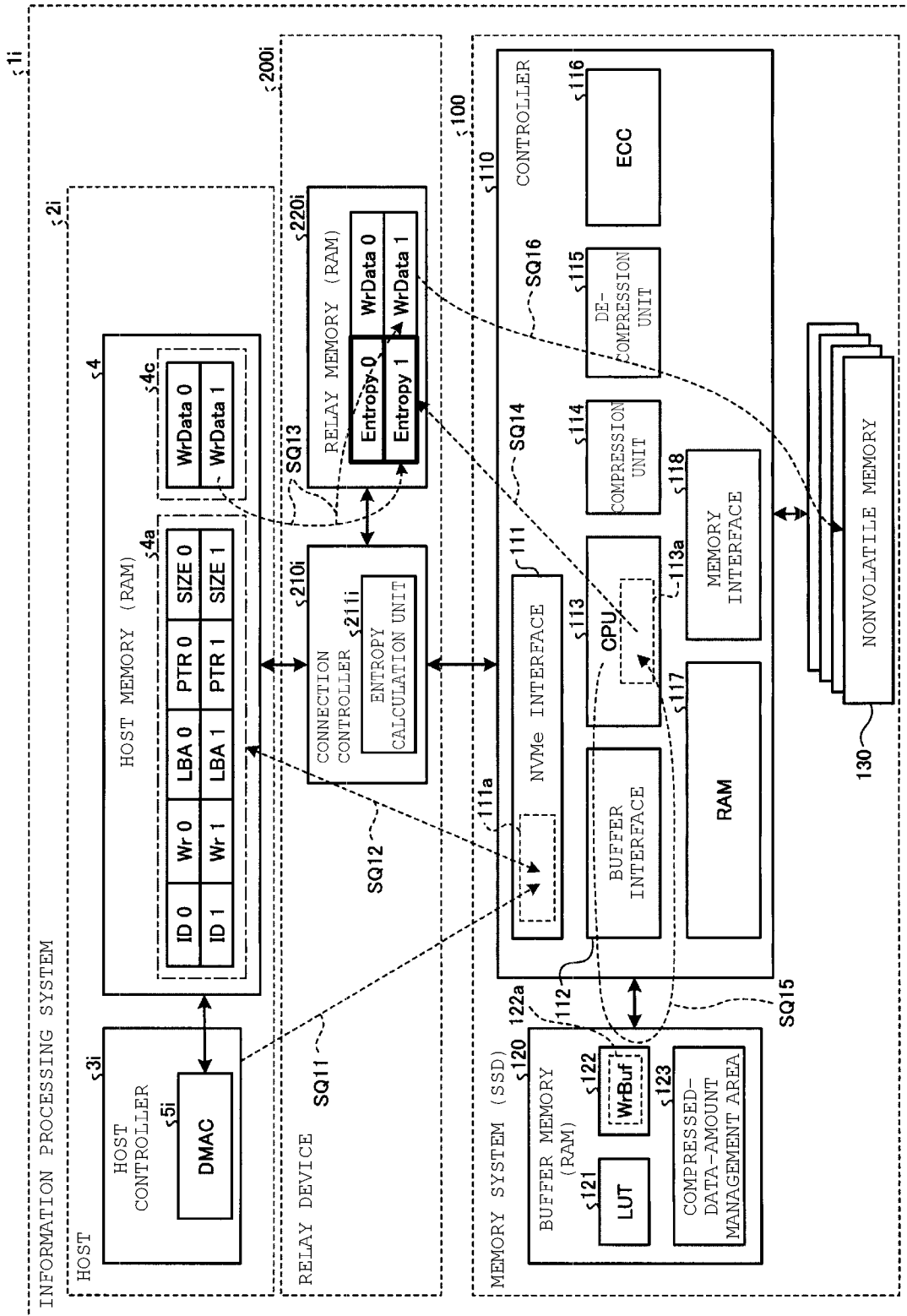
FIG. 7 is a diagram illustrating a configuration and an operation of the information processing system including the memory system according to a second embodiment.

In the second embodiment, as illustrated in FIG. 7, a configuration of an information processing system 1$i$ is different from that of the first embodiment. FIG. 7 is a diagram illustrating a configuration and an operation of the information processing system 1$i$ including a memory system 100 according to the second embodiment.

The information processing system 1$i$ further includes a relay device 200$i$. The relay device 200$i$ is connected between the host 2$i$ and the memory system 100 so as to perform communication with the host 2$i$ and the memory system 100, and relays communication between the host 2$i$ and the memory system 100. The relay device 200$i$ includes a connection controller circuit 210$i$ and a relay memory 220$i$. The connection controller circuit 210$i$ includes an entropy calculation unit 211$i$, which may be implemented as a logic circuit or a programmed microprocessor. That is, entropy information is calculated by the connection controller circuit 210$i$ instead of being calculated by the host 2$i$. According to the configuration, a DMAC 5$i$ of a host controller 3$i$ does not include the entropy calculation unit 5$a$ (refer to FIG. 1). In addition, the entropy information is linked to the write data in the relay memory 220$i$ which functions as a buffer of the connection controller circuit 210$i$. By referring to the entropy information, in what order to compress and write the write data is determined.

Specifically, the information processing system 1$i$ including the memory system 100 operates as follows.

The host 2$i$ stores a valid bit in the doorbell register 111$a$ of the memory system 100, and prompts the memory system 100 to acquire a write command (SQ11). The memory system 100 accesses the command issue queue 4$a$ of the host memory 4 via the connection controller circuit 210$i$, and acquires a write command (SQ12). The connection controller circuit 210$i$ accesses the buffer area 4$c$ of the host memory 4, acquires the write data corresponding to the write command, and stores the acquired write data in the relay memory 220$i$. The entropy calculation unit 211$i$ calculates entropy based on the write data, and stores the calculation result in the relay memory 220$i$, as entropy information (SQ13). At this time, the connection controller circuit 210*i* links the entropy information with the write data, and stores the entropy information and the write data, which are linked to each other, in the relay memory 220*i*.

When the write command is acquired, the memory system 100 accesses the relay memory 220*i*, and acquires the entropy information linked to the write data (SQ14). The memory system 100 performs command execution order determination processing based on the entropy information in the same manner as the method illustrated in FIG. 4, and determines an execution order of the write command (SQ15). The memory system 100 loads the write data on the relay memory 220*i* in the order determined in SQ15, compresses the write data, and writes the compressed write data in the nonvolatile memory 130 (SQ16).

As described above, in the second embodiment, the memory system 100 estimates the compression ratio of the write data using the compression-ratio estimation information linked to the write command corresponding to the write data (i.e., a hint of the compression ratio), and determines the execution order of the write command based on the estimated compression ratio. Thereby, it is also possible to efficiently write the write data in the nonvolatile memory 130 while preventing an increase in capacity of the buffer memory.

Third Embodiment

Next, a memory system according to a third embodiment will be described. Hereinafter, differences from the first embodiment and the second embodiment will be mainly described.

Figure 8:
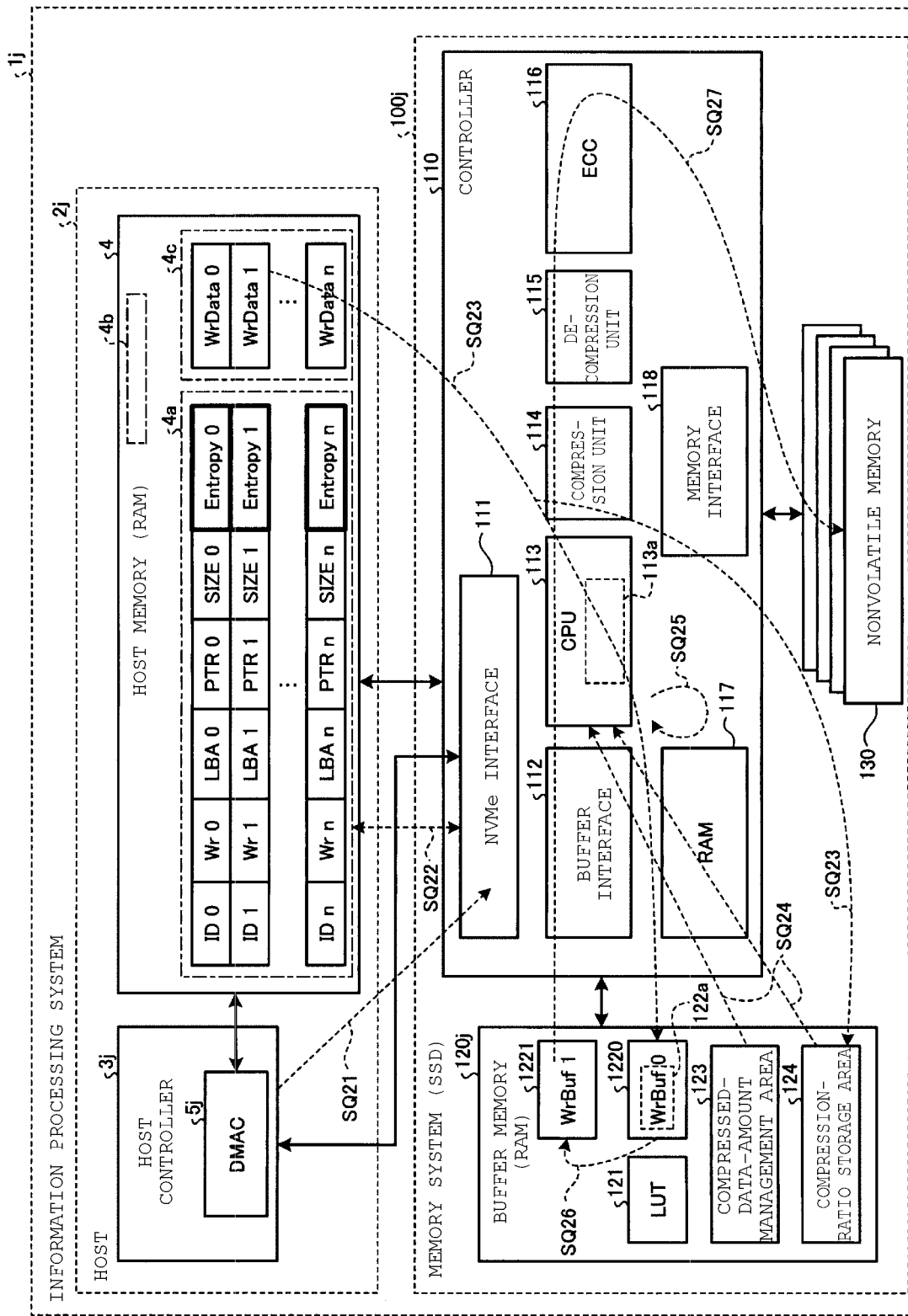
FIG. 8 is a diagram illustrating a configuration and an operation of the information processing system including the memory system according to a third embodiment.

In the first embodiment and the second embodiment, the compression ratio of the write data is estimated for determining the execution order of the write command. In the third embodiment, as illustrated in FIG. 8, the write data is actually compressed to obtain an actual size of the compressed write data, and then the execution order of the write command is determined. FIG. 8 is a diagram illustrating a configuration and an operation of an information processing system 1*j* including a memory system 100*j* according to the third embodiment.

In the information processing system 1*j*, the memory system 100*j* compresses the write data once, and obtains an actual size of the compressed write data. Thus, the memory system 100*j* determines in what order to compress and write the write data by referring to the actual size of the compressed write data. For example, the memory system 100*j* temporarily compresses the write data acquired from a host 2*j* when writing the write data in a buffer memory 120*j*. The memory system 100*j* temporarily stores the compressed write data in a write buffer 1220 of the buffer memory 120*j*, obtains the compression ratio based on the compressed write data, and stores the compression ratio in a compression-ratio storage area 124 of the buffer memory 120*j*.

That is, the buffer memory 120*j* of the memory system 100*j* includes the write buffer 1220 that temporarily stores the compressed write data, in addition to a write buffer 1221 that temporarily stores the write data to be written in the nonvolatile memory 130. In addition, the buffer memory 120*j* includes the compression-ratio storage area 124 that stores the compression ratio. Although the buffer capacity of the buffer memory 120*j* is increased by an amount corresponding to the write buffer 1220 and the compression-ratio storage area 124 compared to the buffer capacity in the first embodiment, the increased amount is much smaller than that in a case of providing a buffer memory including a plurality of buffer areas corresponding to a plurality of levels.

Since there is no need to estimate the compression ratio, a DMAC 5*j* of a host controller 3*j* does not include the entropy calculation unit 5*a* (refer to FIG. 1).

Specifically, the information processing system 1*j* including the memory system 100*j* operates as follows.

Figure 9:
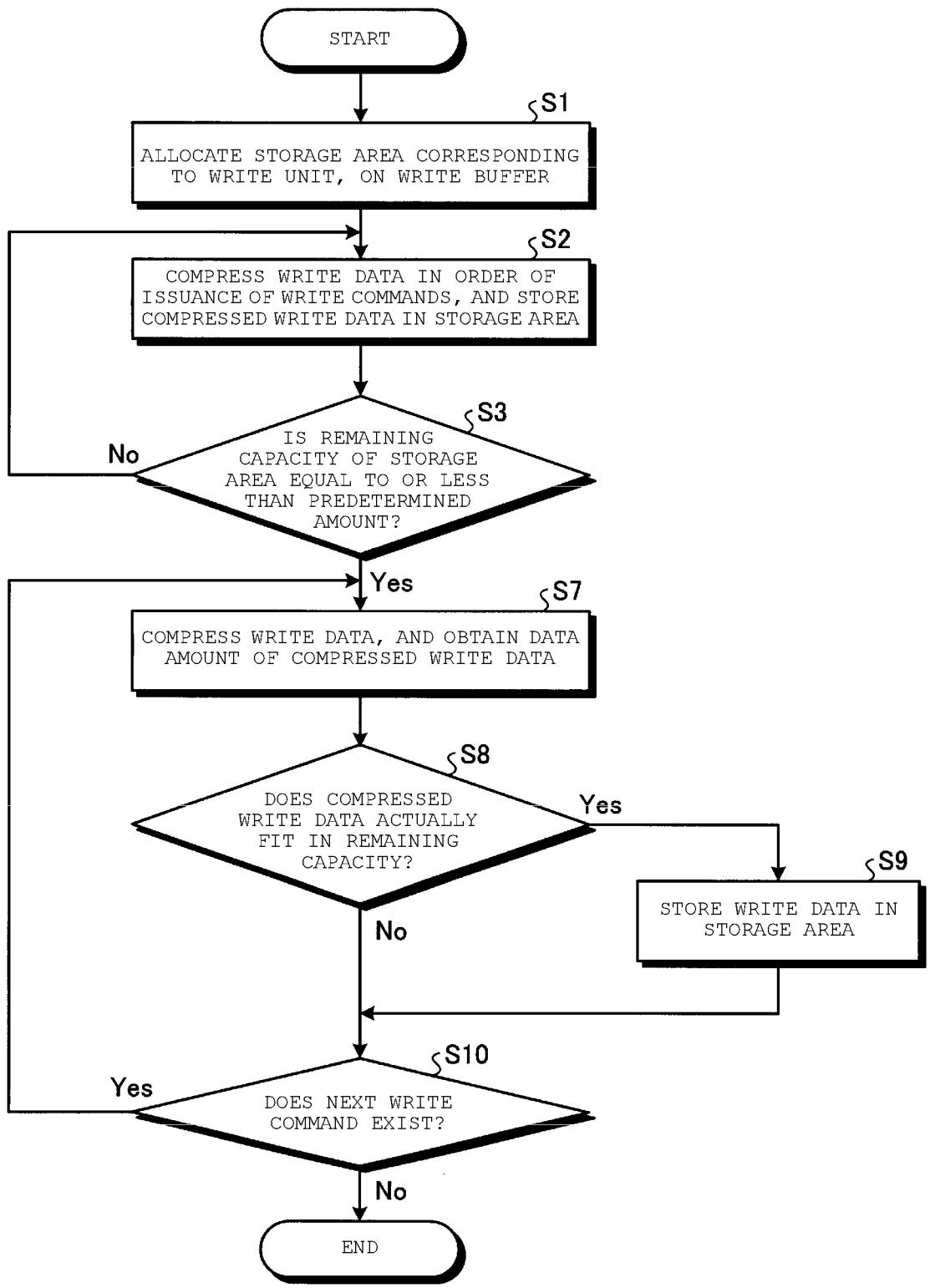
FIG. 9 is a flowchart illustrating the command execution order determination processing according to the third embodiment.

The host 2*j* stores a valid bit in the doorbell register 111*a* of the memory system 100*j*, and prompts the memory system 100*j* to acquire a write command (SQ21). The memory system 100*j* accesses the command issue queue 4*a* of the host memory 4, and acquires a write command (SQ22). The memory system 100*j* acquires the write data from the buffer area 4*c* of the host memory 4, compresses the write data by the compression unit 114, and temporarily stores the compressed write data in the storage area 122*a* allocated on the write buffer (WrBuf0) 1220 of the buffer memory 120*j*. At the same time, the memory system 100*j* obtains the compression ratio based on the compressed write data, and stores the compression ratio in the compression-ratio storage area 124 of the buffer memory 120*j*. The controller 110 (i.e., command execution order determination unit 113*a*) reads the information stored in the compressed-data-amount management area 123 (i.e., information of the total amount of the compressed data included in the write unit) and the compression ratio stored in the compression-ratio storage area 124, and determines the execution order of the write command (SQ15). Specifically, as illustrated in FIG. 9, the controller 110 performs processing in which steps S4 to S6 in FIG. 4 are omitted, and determines the execution order of the write command.

The memory system 100*j* copies the write data corresponding to the write command from the write buffer (WrBuf0) 1220 to the write buffer (WrBuf1) 1221 in the order determined in SQ25. The memory system 100*j* writes the write data from the write buffer 1221 into the nonvolatile memory 130 via the ECC 116.

As described above, in the third embodiment, the write data is actually compressed, and thus the write data can be reliably fitted in the write unit. Therefore, it is possible to efficiently and reliably write the write data in the nonvolatile memory 130.

Fourth Embodiment

Next, a memory system according to a fourth embodiment will be described. Hereinafter, differences from the first embodiment to the third embodiment will be mainly described.

In the third embodiment, the write data is compressed regardless of whether or not the write data can be compressed, and then the execution order of the write command is determined. In the fourth embodiment, the write data is compressed only when the write data can be compressed, and then the execution order of the write command is determined. A configuration of the information processing system 1 including the memory system 100 according to the fourth embodiment may be the same as that in the first embodiment.

Figure 10:
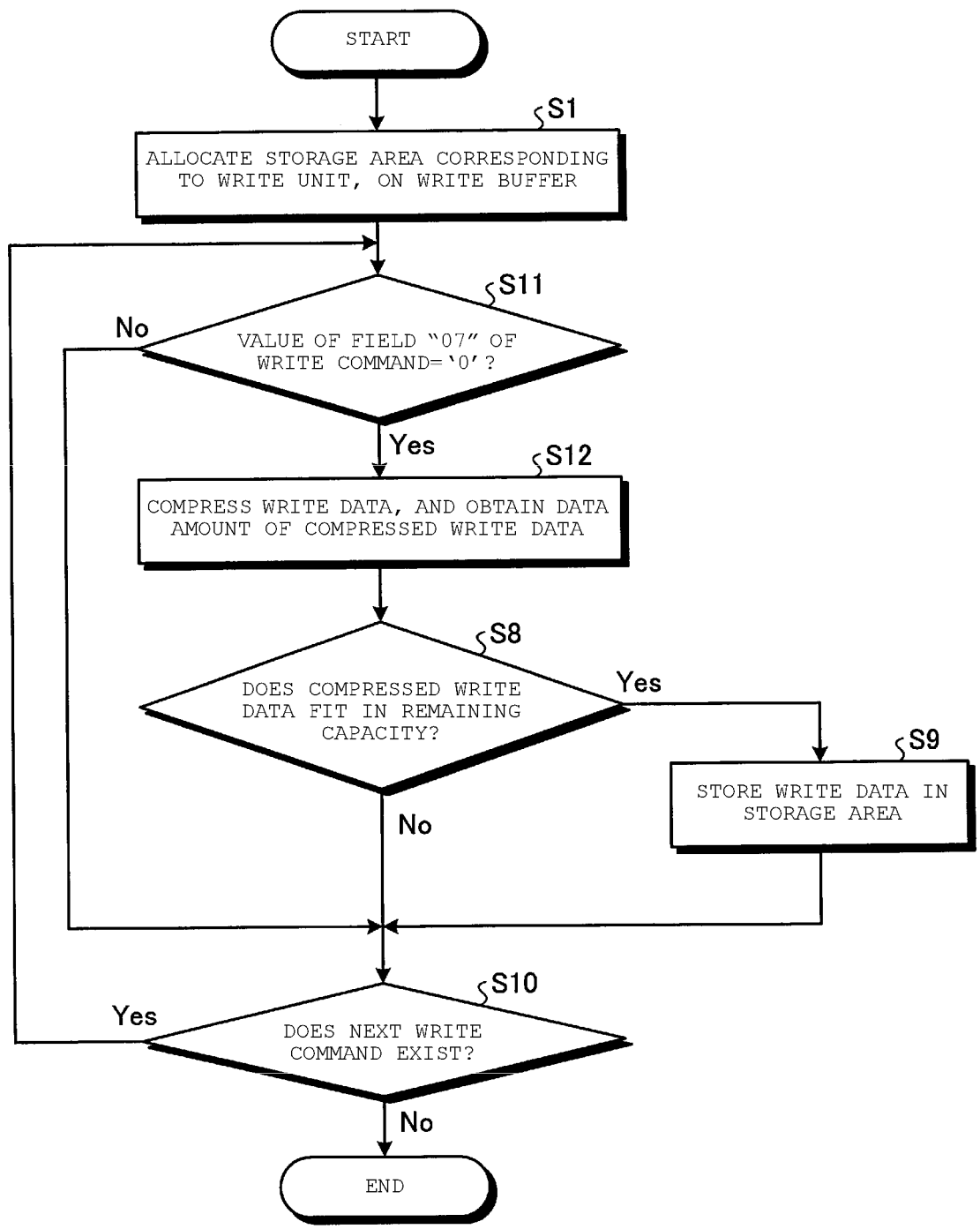
FIG. 10 is a flowchart illustrating the command execution order determination processing according to a fourth embodiment.

Specifically, as illustrated in FIG. 10, details of the command execution order determination processing of SQ7 illustrated in FIG. 2 are different from the processing according to the first embodiment in the following points.

After processing of S1, the memory system 100 confirms whether or not a value of a field indicating whether the write data of the write command cannot be compressed is 0 (i.e., field "07" in the NVMe standard) (S11). When the value of the field "07" is not 0, that is, when the value of the field "07" is 1 ("No" in S11), the memory system 100 determines that the write data cannot be compressed, and proceeds to processing of S10. When the value of the field "07" is 0 ("Yes" in S11), the memory system 100 determines that the write data can be compressed, compresses the write data, and obtains the data amount of the compressed write data (S12). Then, the memory system 100 performs processing of S8 and subsequent processing.

As described above, the memory system 100 according to the fourth embodiment compresses the write data when the write data can be compressed, and writes the compressed write data in the nonvolatile memory 130. Thereby, it is possible to efficiently write the write data in the nonvolatile memory 130.

Fifth Embodiment

Next, a memory system according to a fifth embodiment will be described. Hereinafter, differences from the first embodiment to the fourth embodiment will be mainly described.

In the fourth embodiment, it is determined whether or not the compressible write data fits in the storage area corresponding to the write unit. In the fifth embodiment, it is determined whether or not incompressible write data as well as whether or not the compressible write data fits in the storage area corresponding to the write unit.

Figure 11:
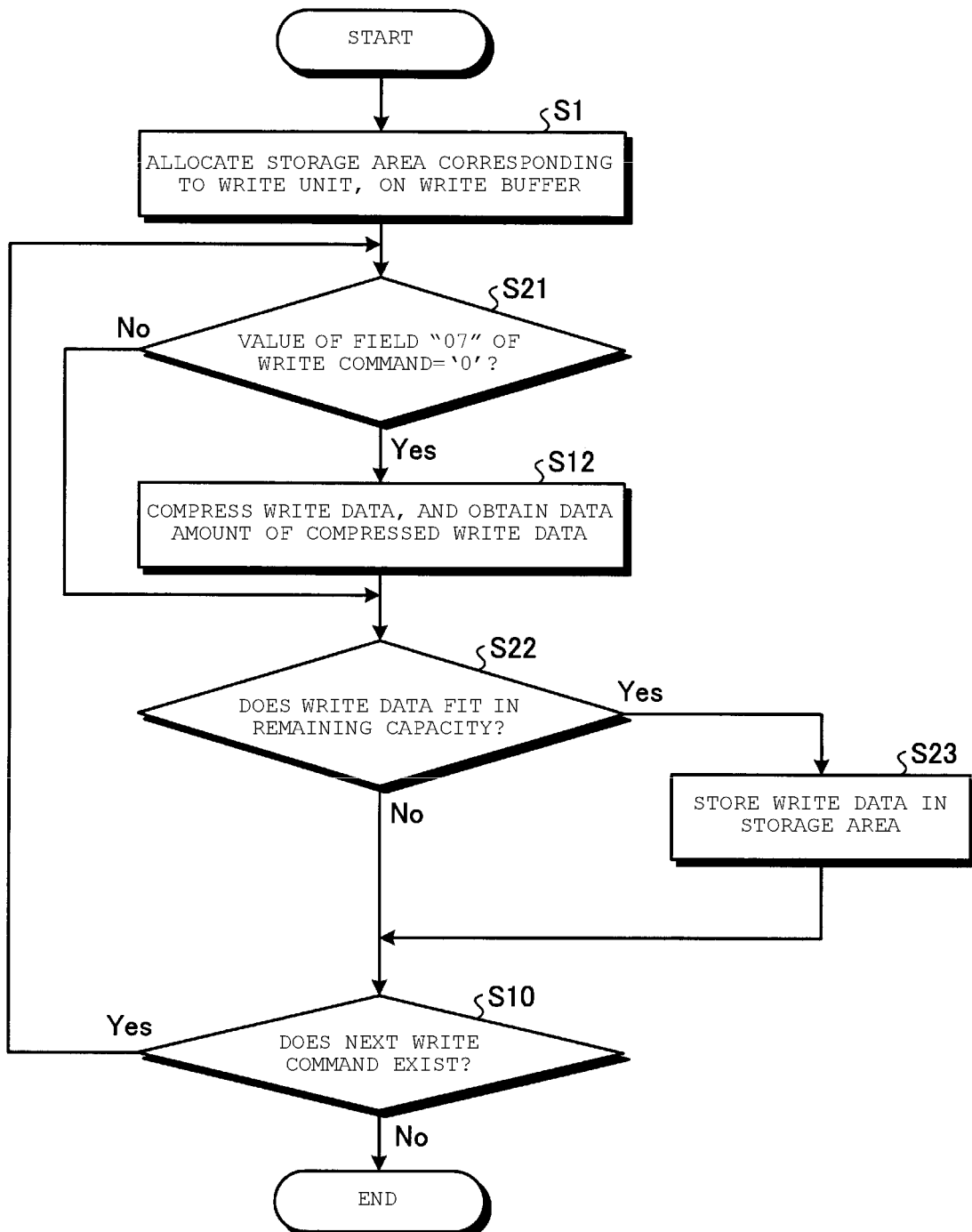
FIG. 11 is a flowchart illustrating the command execution processing according to a fifth embodiment.

Specifically, as illustrated in FIG. 11, details of the command execution order determination processing of SQ7 illustrated in FIG. 2 are different from the processing according to the first embodiment in the following points.

After processing of S1, the memory system 100 confirms whether or not a value of a field indicating whether the write data of the write command cannot be compressed (i.e., field "07") is 0 (S21). When the value of the field "07" is not 0, that is, when the value of the field "07" is 1 ("No" in S21), the memory system 100 determines that the write data cannot be compressed, and determines whether or not the uncompressed write data fits in the remaining area 122a1 of the storage area 122a (S22). When the uncompressed write data fits in the remaining area 122a1 ("Yes" in S22), the memory system 100 stores the uncompressed write data in the storage area 122a (that is, the remaining area 122a1) (S23). When the value of the field "07" is 0 ("Yes" in S21), the memory system 100 determines that the write data can be compressed, compresses the write data (S12), and determines whether or not the compressed write data fits in the remaining area 122a1 of the storage area 122a (S22). When the compressed write data fits in the remaining area 122a1 ("Yes" in S22), the memory system 100 stores the compressed write data in the storage area 122a (that is, the remaining area 122a1) (S23). Thereafter, processing of S10 is performed.

As described above, the memory system 100 according to the fifth embodiment compresses the write data when the write data can be compressed, and writes the compressed write data in the nonvolatile memory 130, as in the fourth embodiment. Thereby, it is possible to efficiently write the write data in the nonvolatile memory 130.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory;
   an interface circuit; and
   a controller configured to
      upon receipt of a plurality of write commands for storing write data in the nonvolatile memory via the interface circuit, acquire compression-ratio information about the write data associated with each write command,
      determine a compression ratio of each write data based on the acquired compression-ratio information, and
      determine an execution order of the write commands based on the determined compression ratio.

2. The memory system according to claim 1, wherein the compression-ratio information indicates an entropy of each write data.

3. The memory system according to claim 2, further comprising:
   a volatile memory in which the compression ratio is stored in association with the entropy.

4. The memory system according to claim 1, wherein the compression-ratio information is indicated in a predetermined field of each write command.

5. The memory system according to claim 4, wherein the write commands conform to an NVMe standard.

6. The memory system according to claim 1, wherein the compression-ratio information is determined by a host that issues the write commands.

7. The memory system according to claim 1, wherein the controller acquires the write commands and the compression-ratio information from a relay device via the interface circuit.

8. The memory system according to claim 7, wherein the compression-ratio information is determined by the relay device.

9. The memory system according to claim 1, wherein the write commands include first, second, and third write commands issued in this order and associated with first, second, and third write data, respectively, and
   upon receipt of the write commands and the first, second, and third write data, the controller determines the execution order of the write commands to be different from the issued order of the write commands if the first and second write data cannot be stored in a predetermined storage area and the first and third write data or the second and third write data can be stored in the predetermined storage area.

10. The memory system according to claim 9, wherein the controller comprises a buffer memory, and
the predetermined storage area is allocated in the buffer memory.

11. A memory system comprising:
   a nonvolatile memory;
   an interface circuit; and
   a controller configured to
      upon receipt of a plurality of write commands for storing write data in the nonvolatile memory via the interface circuit, compress the write data associated with each write command,
      determine a data size of each compressed write data, and determine an execution order of the write commands based on the determined data size.

12. The memory system according to claim 11, further comprising:
a buffer memory in which the compressed write data is stored.

13. The memory system according to claim 11, wherein the controller is further configured to determine whether each write data can be compressed, and
the controller determines the data size only when the write data can be compressed.

14. The memory system according to claim 13, wherein the controller determines whether each write data can be compressed by referring to a predetermined field of the corresponding write command.

15. The memory system according to claim 14, wherein the write commands conform to an NVMe standard.

16. The memory system according to claim 11, wherein the write commands include first, second, and third write commands issued in this order and associated with first, second, and third write data, respectively, and
upon receipt of the write commands and the first, second, and third write data, the controller determines the execution order of the write commands to be different from the issued order of the write commands if the first and second write data cannot be stored in a predetermined storage area and the first and third write data or the second and third write data can be stored in the predetermined storage area.

17. The memory system according to claim 16, wherein the controller includes a buffer memory, and the predetermined storage area is allocated in the buffer memory.

18. A memory system comprising:
a nonvolatile memory;
an interface circuit; and
a controller configured to
upon receipt of a plurality of write commands for storing write data in the nonvolatile memory via the interface circuit, determine whether the write data associated with each write command can be compressed by referring to a predetermined field of the write command,
compress each write data that can be compressed,
determine a data size of each compressed and uncompressed write data, and
determine an execution order of the write commands based on the determined data size.

19. The memory system according to claim 18, wherein the write commands conform to an NVMe standard.

20. The memory system according to claim 18, wherein the write commands include first, second, and third write commands issued in this order and associated with first, second, and third write data, respectively, and
upon receipt of the write commands and the first, second, and third write data, the controller determines the execution order of the write commands to be different from the issued order of the write commands if the first and second write data cannot be stored in a predetermined storage area and the first and third write data or the second and third write data can be stored in the predetermined storage area.

* * * * *